United States Patent
Hu

(10) Patent No.: US 6,583,038 B2
(45) Date of Patent: Jun. 24, 2003

(54) POLYCIDE STRUCTURE AND METHOD FOR FORMING POLYCIDE STRUCTURE

(75) Inventor: Yongjun Jeff Hu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/079,404

(22) Filed: Feb. 22, 2002

(65) Prior Publication Data

US 2002/0079548 A1 Jun. 27, 2002

Related U.S. Application Data

(62) Division of application No. 09/196,437, filed on Nov. 20, 1998, now Pat. No. 6,392,302.

(51) Int. Cl.[7] .................................................. H01L 21/44
(52) U.S. Cl. ................................... 438/592; 438/648
(58) Field of Search ................................. 438/592, 593, 438/594, 648, 649

(56) References Cited

U.S. PATENT DOCUMENTS

| | | | |
|---|---|---|---|
| 4,822,749 A | | 4/1989 | Flanner et al. |
| 5,135,882 A | * | 8/1992 | Karniewicz ............... 438/385 |
| 5,204,285 A | | 4/1993 | Kakiuchi |
| 5,346,836 A | * | 9/1994 | Manning et al. ........... 438/307 |
| 5,543,362 A | * | 8/1996 | Wu ............................ 438/303 |
| 5,545,574 A | * | 8/1996 | Chen et al. ................ 438/297 |
| 5,635,765 A | * | 6/1997 | Larson ....................... 257/768 |
| 5,710,454 A | | 1/1998 | Wu |
| 5,739,064 A | * | 4/1998 | Hu et al. .................... 438/528 |
| 5,739,579 A | * | 4/1998 | Chiang et al. ............. 257/635 |
| 5,763,923 A | * | 6/1998 | Hu et al. .................... 257/382 |
| 5,783,471 A | * | 7/1998 | Chu ............................ 438/257 |
| 5,804,472 A | * | 9/1998 | Balasinski et al. ......... 438/158 |
| 5,818,092 A | * | 10/1998 | Bai et al. ................... 257/388 |
| 5,945,719 A | | 8/1999 | Tsuda |

* cited by examiner

*Primary Examiner*—Craig Thompson
(74) *Attorney, Agent, or Firm*—Dickstein Shapiro Morin & Oshinsky, LLP

(57) ABSTRACT

A polycide structure for use in an integrated circuit comprises a silicon layer; a barrier layer comprising $ZSi_x$ where x is greater than two and Z is chosen from the group consisting of tungsten, tantalum and molybdenum; and a metal silicide layer, preferably cobalt silicide. The structure is particularly useful in applications requiring high temperature processing. The structure may be used as a gate stack, especially in memory applications such as DRAM. The structure provides thermal stability, thus avoiding agglomeration problems associated with high temperature processing combined with low resistivity.

68 Claims, 16 Drawing Sheets

POLYCIDE STRUCTURE AND METHOD FOR FORMING POLYCIDE STRUCTURE

This application is a divisional of U.S. patent application number 09/196,437, entitled "POLYCIDE STRUCTURE AND METHOD FOR FORMING POLYCIDE STRUCTURE" and filed Nov. 20, 1998, now U.S. Pat. No. 6,392,302 the entirety of which is hereby incorporated by reference.

BACKGROUND OF THE INVENTION

1. Field of the Invention

The present invention relates generally to the field of semiconductor fabrication, and more specifically to deep sub-micron fabrication of low resistance polycide structures.

2. Description of the Related Art

The drive to integrate ever-increasing numbers of transistors onto a single integrated circuit necessitates the fabrication of increasingly smaller MOSFET (metal oxide semiconductor field effect transistor) and interconnection structures in semiconductor devices. Nowhere is this more true than in memory circuits. Current process technology has allowed the reduction of the line size (the width of conductive paths in an integrated circuit) to the deep sub-micron (<0.2 micron) level. At this level, the resistance of the gate stack, also known as a gate electrode (the conductive structure that forms the gate of a transistor), and interconnection layers, becomes a limiting factor in the speed of the device. Accordingly, it has become increasingly important to use materials with the lowest possible resistance to form gate stacks and interconnection layers.

Historically, polysilicon has been used as the material for gate stacks because of many advantageous properties including good thermal stability and low resistance. Polysilicon is especially well suited for the interface to gate oxide layers in gate stacks. Polysilicon sheet resistances of 15–20 ohms/sq m may be achieved using known techniques. However, resistances even this low become significant in deep sub-micron fabrication.

Refractory metal suicides and near-noble metal suicides are well known to those of skill in the art of semiconductor fabrication. The low sheet resistance (as low as 3–5 ohms/sq m) of such metal silicides and the ability to use such metal silicides with conventional semiconductor techniques has led to increasing use of these materials in semiconductor devices. For example, titanium disilicide ($TiSi_2$) is known to have a low sheet resistance and is widely used for gate stacks and interconnection layers in semiconductor devices.

However, refractory and near-noble metal silicides suffer from a serious drawback which makes them unsuitable for certain applications. Many semiconductor fabrication processes, especially memory cell fabrication processes, require high temperature (approximately 800° C. to 1000° C. or above) annealing, reoxidation and activation cycles. At high temperatures, refractory and near-noble metal silicides suffer from the well-known problem of thermal agglomeration. Silicides become unstable and begin to agglomerate, or bubble, at high temperatures, especially along boundaries with polysilicon or $SiO_2$, which causes dislocations or discontinuities in the silicide at the boundaries. Although the exact mechanisms of agglomeration are complex and varied, it is widely accepted that a major contributing factor to agglomeration is the action of polysilicon grain boundaries as rapid diffusion routes for transporting silicon which diffuses out of polysilicon or $SiO_2$ during high temperature processing such as annealing. Thus, most refractory and near noble metal silicides cannot be used alone in gate stacks and other structures in which they adjoin polysilicon or $SiO_2$ when high temperature processing is required.

The aforementioned agglomeration problem associated with high temperature processing of most refractory metal silicides has led to the creation of modified structures consisting of 1) a polysilicon layer at a polysilicon or $SiO_2$ boundary (such as the gate oxide in a gate stack), 2) a diffusion barrier layer, and 3) a refractory or near noble metal silicide layer. The diffusion barrier layer prevents the diffusion of metals from the metal silicide layer into the polysilicon layer during the formation of the metal silicide layer and does not itself agglomerate at its interface with polysilicon or $SiO_2$. Such structures are known as polycides and, when used to form source/drain or gate electrodes, as salicides (self aligned silicides). As used herein, the term polycide is used generically to refer to both polycide and salicide structures. These structures combine the advantages of the good interface provided by polysilicon with the low resistance of metal silicides while avoiding the thermal agglomeration problem associated with metal silicide interfaces caused by high temperature processing.

Diffusion barrier layers for polycide structures are disclosed in U.S. Pat. Nos. 5,818,092 (the "'092 patent") and 5,543,362 (the "'362 patent"). The '092 teaches a barrier layer composed of an oxide, silicon nitride, an oxynitride, or a thin metal layer such as titanium nitride or tantalum nitride. Of these materials, only titanium nitride or tantalum nitride are conductive and therefore only these materials may be used when conductivity is required (oxides, silicon nitride and oxynitrides are used in the formation of floating gates—gates that are electrically isolated—in applications such as flash memory devices). The '362 patent discloses diffusion barrier layers of titanium nitride, boron nitride, pure refractory metals, and intermettalic alloys of tungsten, platinum and cobalt. Experience has shown that using any of these known materials is problematic because these materials tend to oxidize during high temperature processes, such as source/drain reoxidation, that are typically performed during DRAM fabrication.

Thus, what is needed is a conductive polycide structure that is tolerant of high temperature processing and that exhibits good self-passivation (resistance to oxidation).

SUMMARY OF THE INVENTION

The present invention provides a polycide structure comprising a lower polysilicon layer, a conductive barrier layer comprising $ZSi_x$, where $x>2$ and Z is either tungsten, molybdenum or tantalum, and an upper refractory or near-noble metal silicide layer. Although $ZSi_x$ ($x>2$, Z=W, Ta, or Mo) are refractory metal silicides, experience has shown that they exhibit good thermal stability and do not agglomerate at polysilicon or $SiO_2$ interfaces even at high temperatures. The present invention is especially well suited for use in gate stacks and/or interconnection layers in semiconductor applications, especially memory circuits, where low resistance is necessary and high temperature processing steps are employed.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF THE PREFERRED EMBODIMENTS

The present invention will be illustrated through use as a gate stack in a standard two cell bitline over capacitor DRAM configuration, which consists of two transistors sharing a common source/drain active area connected to a bit line and two stacked container capacitors. It will be obvious to those of skill in the art that the invention is capable of numerous other uses in semiconductor fabrication, such as in other DRAM configurations, SRAMs, or many other logic circuits or combinations of logic circuits and memory circuits. Numerous specific details, such as materials, thicknesses, etc., are set forth in order to provide a thorough understanding of the present invention. It will be obvious, however, to one skilled in the art that the present invention is capable of many different embodiments and that the present invention may be practiced without the specific details set forth herein. Accordingly, the drawings and description are to be regarded as illustrative in nature and not as restrictive.

Figure 1:
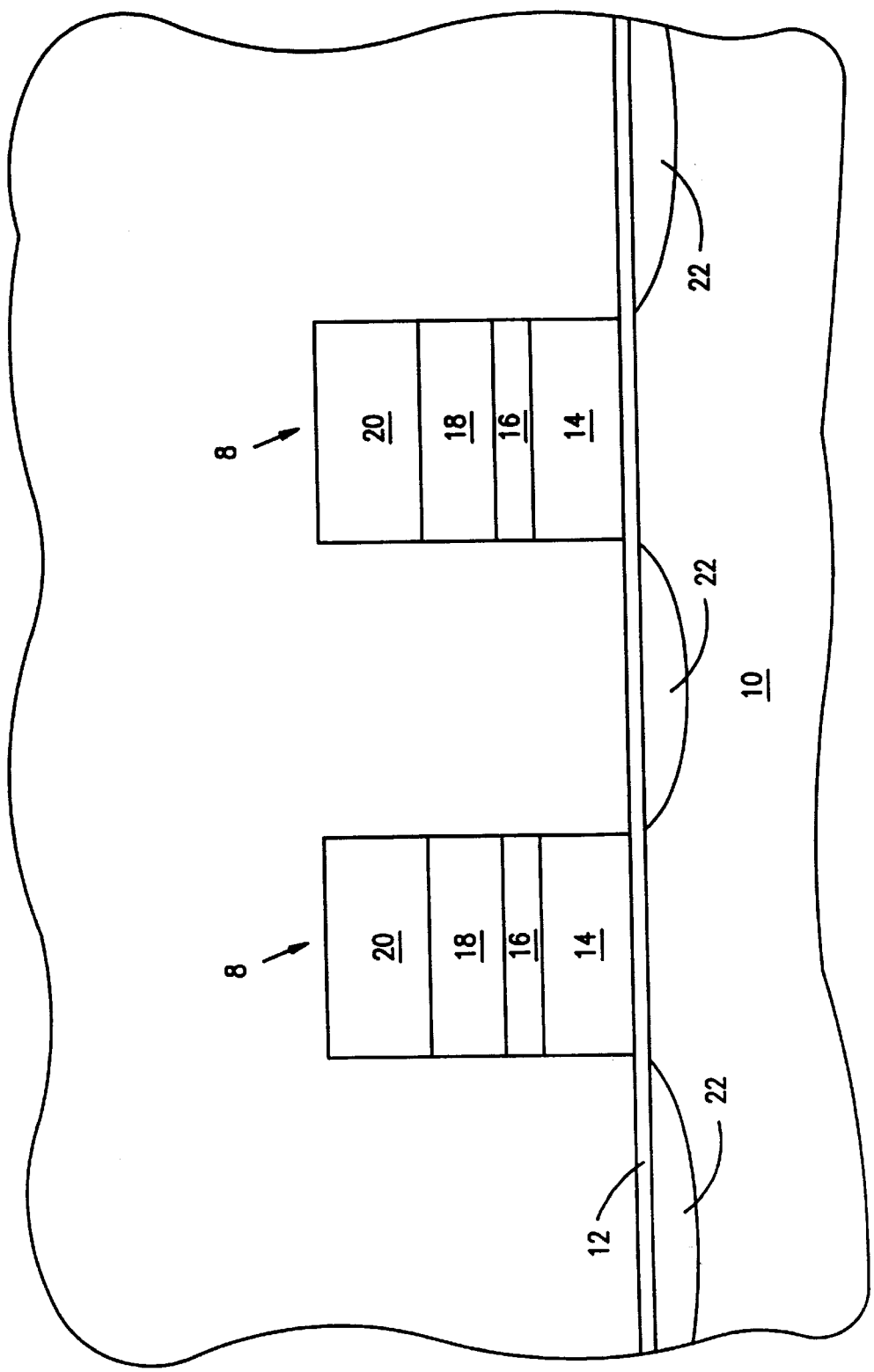
FIG. 1 is a diagrammatic cross-sectional view of a portion of a semiconductor wafer at an early processing step according to one embodiment of the present invention.

FIG. 1 depicts a silicon wafer 10 at an early processing stage. A thin gate oxide layer 12 has been formed on silicon wafer 10 using a conventional technique such as thermal oxidation. Gate stacks 8 have been formed on silicon wafer 10. The gate stacks are formed by depositing a lower polysilicon layer 14, a diffusion barrier layer of $ZSi_x$ (x>2; Z=W, Ta, or Mo), an upper polysilicon layer 18, and a nitride layer 20. In the preferred embodiment, the lower polysilicon layer 14 is between 450–3000 Å (preferably 650 Å) thick; the barrier layer 16 is between 150–300 Å (preferably 150 Å) thick; the upper polysilicon 18 layer is between 300–2500 Å (preferably 650 Å) thick, and the nitride layer 20 is between 500–2000 Å thick.

After the layers have been deposited, the gate stacks 8 are formed by dry etch patterning with the etching stopped at the gate oxide layer 12. After the gate stacks 8 have been formed, source/drain reoxidation is performed. The source and drain regions 22 are then formed using a conventional technique such as ion implantation.

Figure 2:
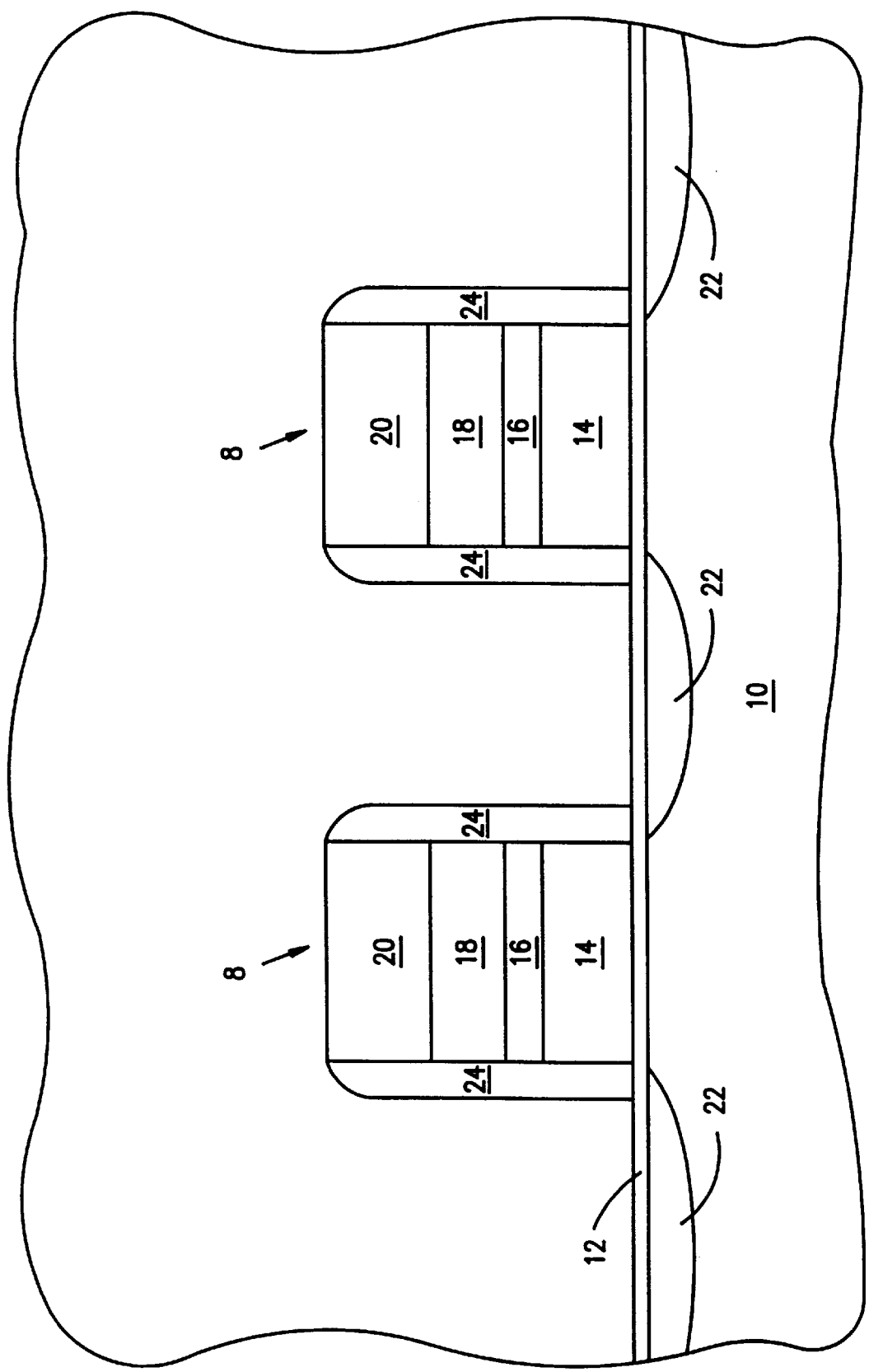
FIG. 2 is a diagrammatic cross-sectional view of a portion of a semiconductor wafer at a processing step subsequent to that shown in FIG. 1.

After the source and drain regions 22 have been formed, spacers 24 are formed along the sides of the gate stacks 8 as shown in FIG. 2. The spacers 24 may be formed of TEOS (tetraethyloxysilicate) using any conventional deposition and etch back technique. At the completion of the spacer etch back, the nitride layer 20 is again exposed.

It should be noted that, as discussed in the preceding paragraphs, source/drain reoxidation and source/drain ion implantation occur before the TEOS spacer 24 formation. It will be apparent to those of ordinary skill in the art that these steps could also be performed after as well as before the TEOS spacer 24 formation.

Figure 3:
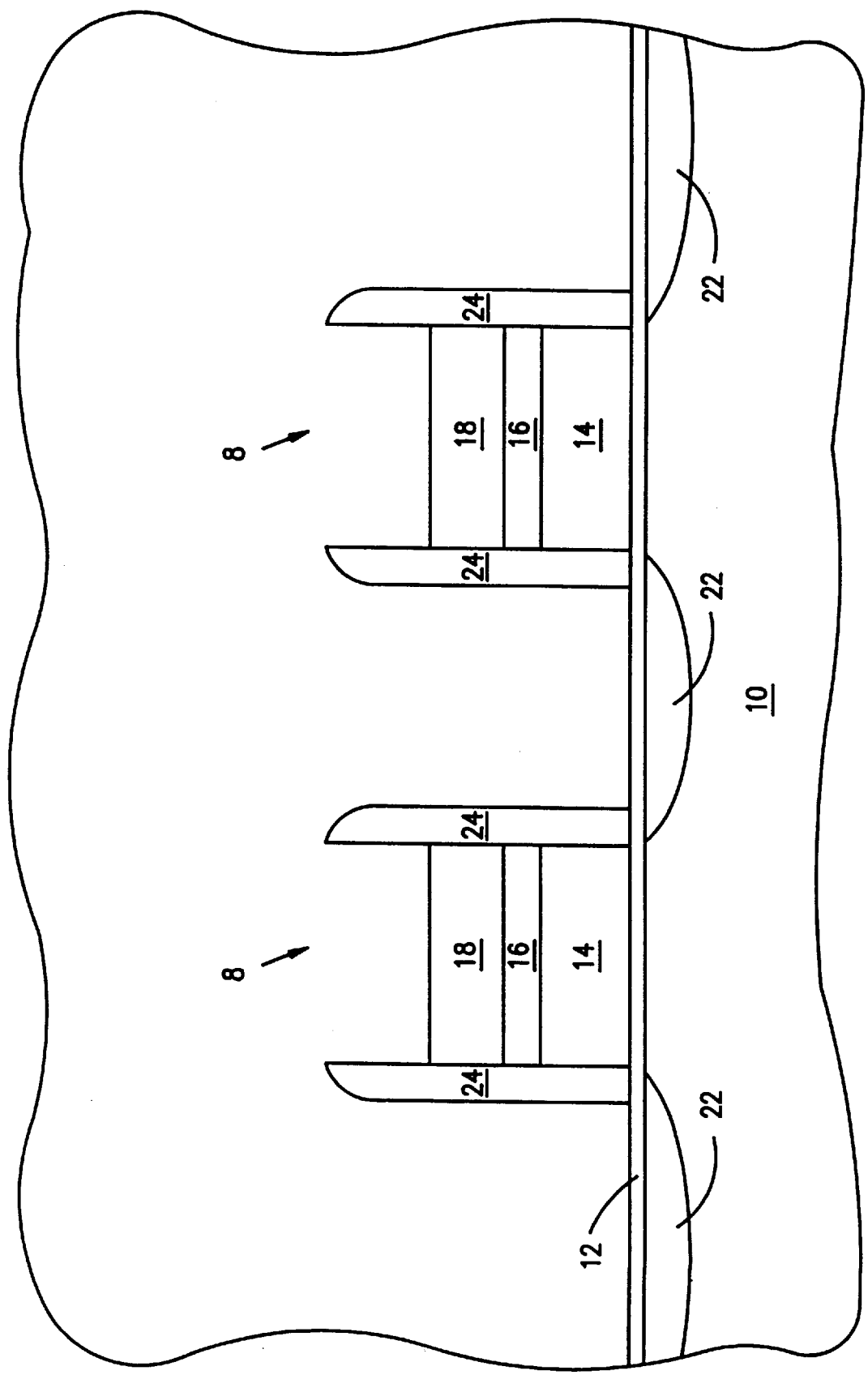
FIG. 3 is a diagrammatic cross-sectional view of a portion of a semiconductor wafer at a processing step subsequent to that shown in FIG. 3.

Referring now to FIG. 3, the nitride layer 20 (not shown in FIG. 3) has been selectively wet-etched using diluted (25:1) hot phosphoric acid. The phosphoric acid etches nitride at a rate of approximately 45 Å/min, while etching TEOS at only approximately 1 Å/min and $SiO_2$ even more slowly. After the selective etch of the nitride layer 20, the entire structure is dip-cleaned in diluted (100:1) hydroflouric acid.

Figure 4:
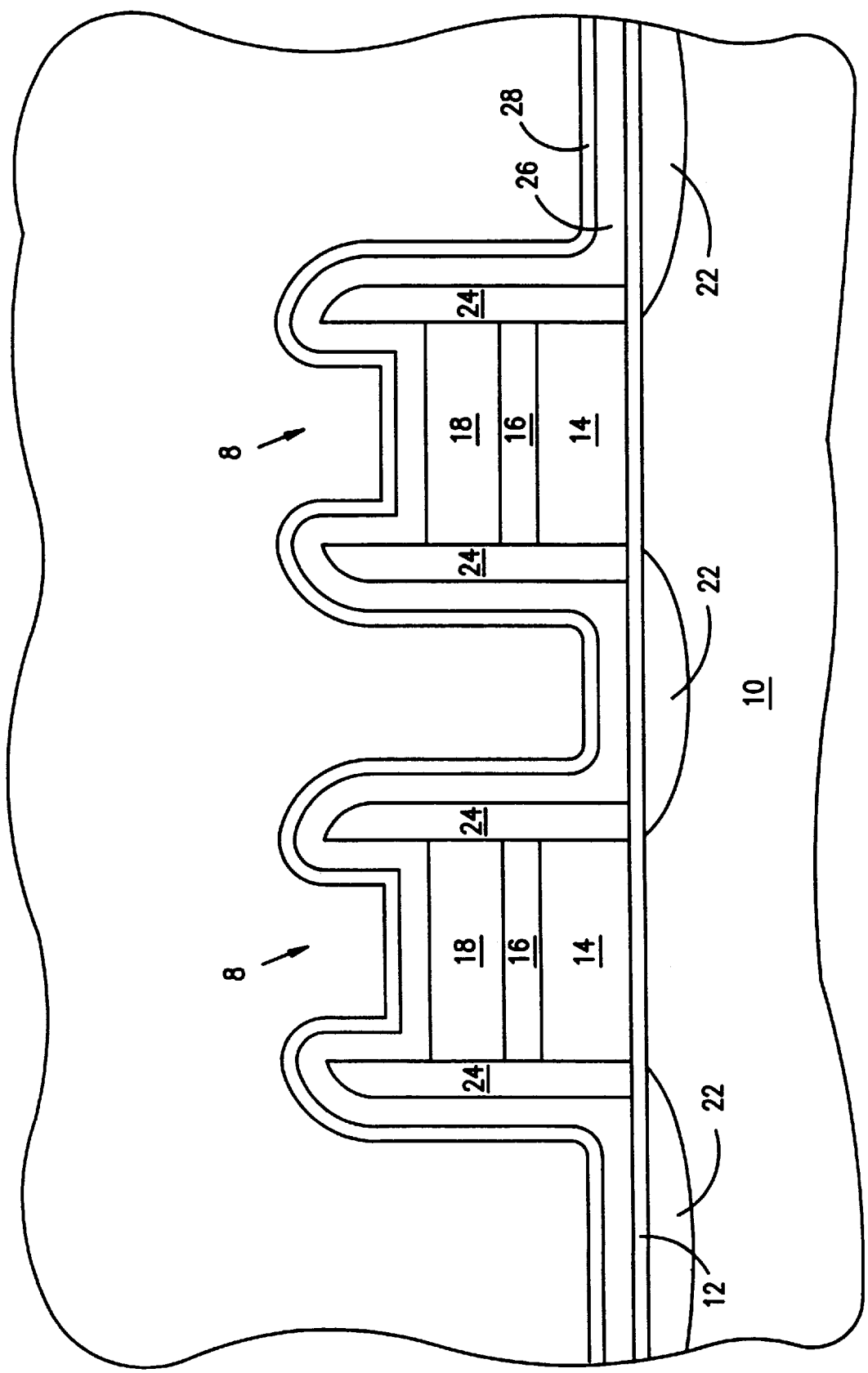
FIG. 4 is a diagrammatic cross-sectional view of a portion of a semiconductor wafer at a processing step subsequent to that shown in FIG. 3
Figure 5:
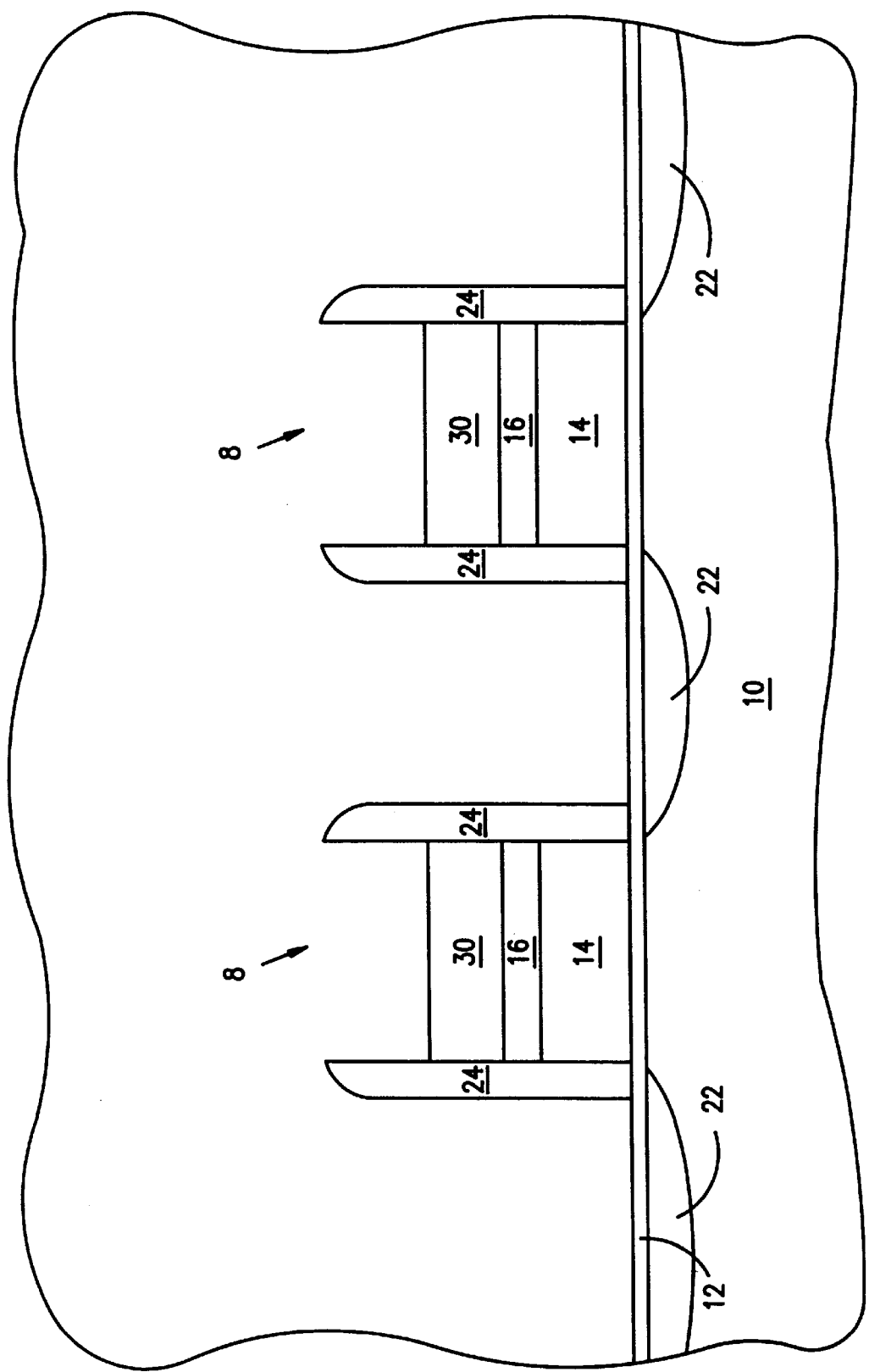
FIG. 5 is a diagrammatic cross-sectional view of a portion of a semiconductor wafer at a processing step subsequent to that shown in FIG. 4.

Referring now to FIG. 4, a 75–750 Å thick layer 26 of cobalt is then deposited using a physical vapor deposition (PVD) technique, preferably sputtering. A thin (approximately 100 Å) layer 28 of titanium is also deposited. The titanium layer is optional. The wafer 10 is then annealed at approximately 600° C. for approximately 30 seconds in a nitrogen environment to cause the upper polysilicon layer 18 to become transformed into a cobalt silicide layer 30, as shown in FIG. 5. The amount of silicon consumed during the formation of the cobalt silicide layer 30 is approximately 3.6 times greater than the amount of cobalt. If metals other than cobalt are used, the thicknesses of the upper polysilicon layer 18 and the thick layer 26 will have to be adjusted accordingly. For example, the amount of nickel consumed during the formation of nickel silicide is approximately equal to (rather than 3.6 times greater than) the amount of silicon. The remaining unreacted cobalt and titanium are then removed. The titanium may be removed with an APM (amonia+hydrogen peroxide solution+pure water) solution for five minutes at 65° C. The cobalt may be removed with an HPM (hydrochloric acid+hydrogen peroxide solution+ pure water) solution for 30 seconds at 30° C.

Although cobalt is used in the preferred embodiment, other refractory or near-noble metals could also be used. However, it is important that the silicide of the metal have a grain size smaller than the critical dimension of the line width as well as low resistivity. For example, cobalt silicide has a grain size of less than 75 Å and has very low sheet resistance (3–5 ohms) and bulk resistivity (12–15 microohms/cm), which makes it a good choice for a deep submicron application with a 0.12 micron line width. Other metal silicides with small grain sizes and low resistivity that may be appropriate (depending upon the application) include nickel silicide, platinum silicide, palladium silicide and iridium silicide.

Figure 6:
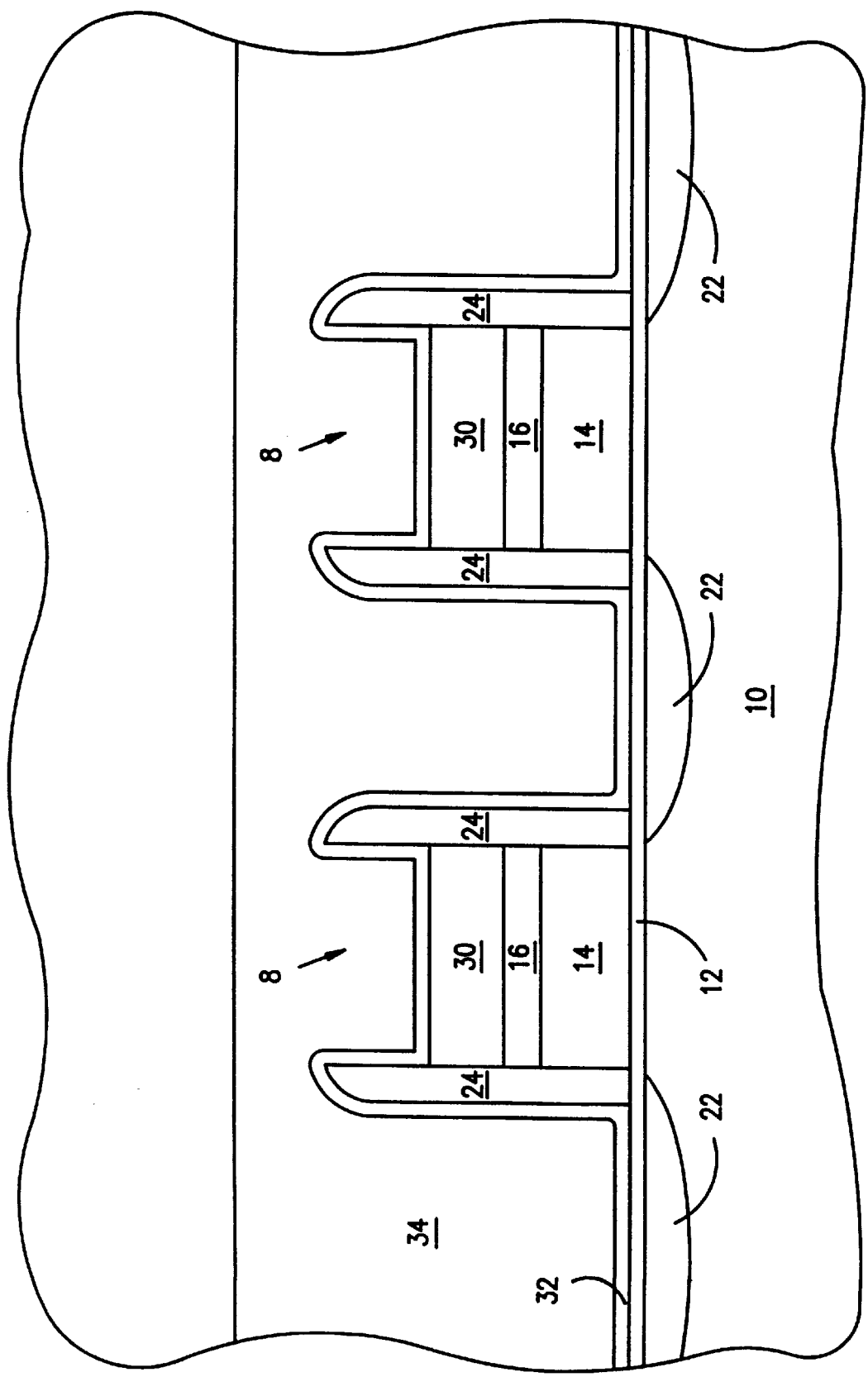
FIG. 6 is a diagrammatic cross-sectional view of a portion of a semiconductor wafer at a processing step subsequent to that shown in FIG. 5.
Figure 7:
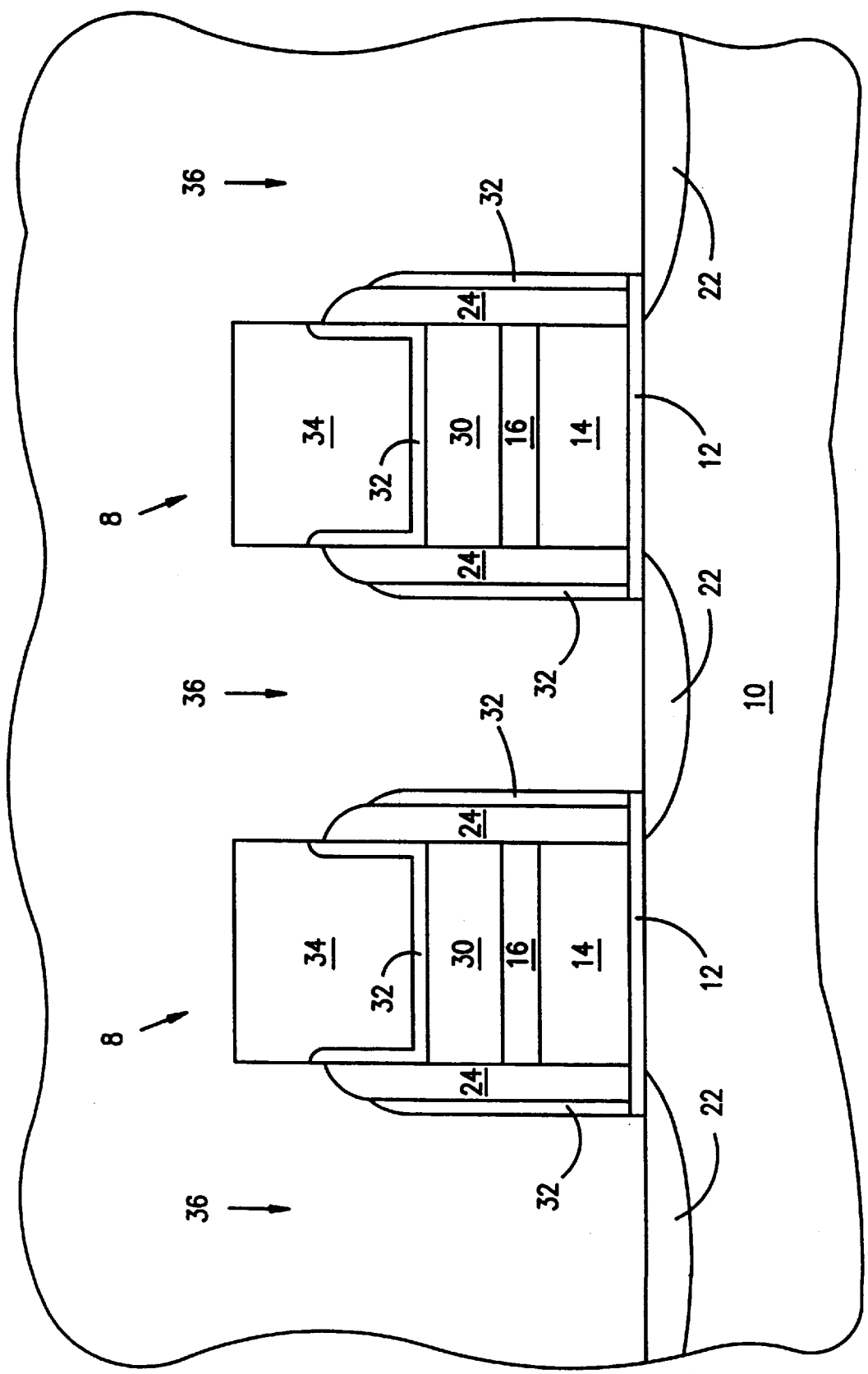
FIG. 7 is a diagrammatic cross-sectional view of a portion of a semiconductor wafer at a processing step subsequent to that shown in FIG. 6.
Figure 8:
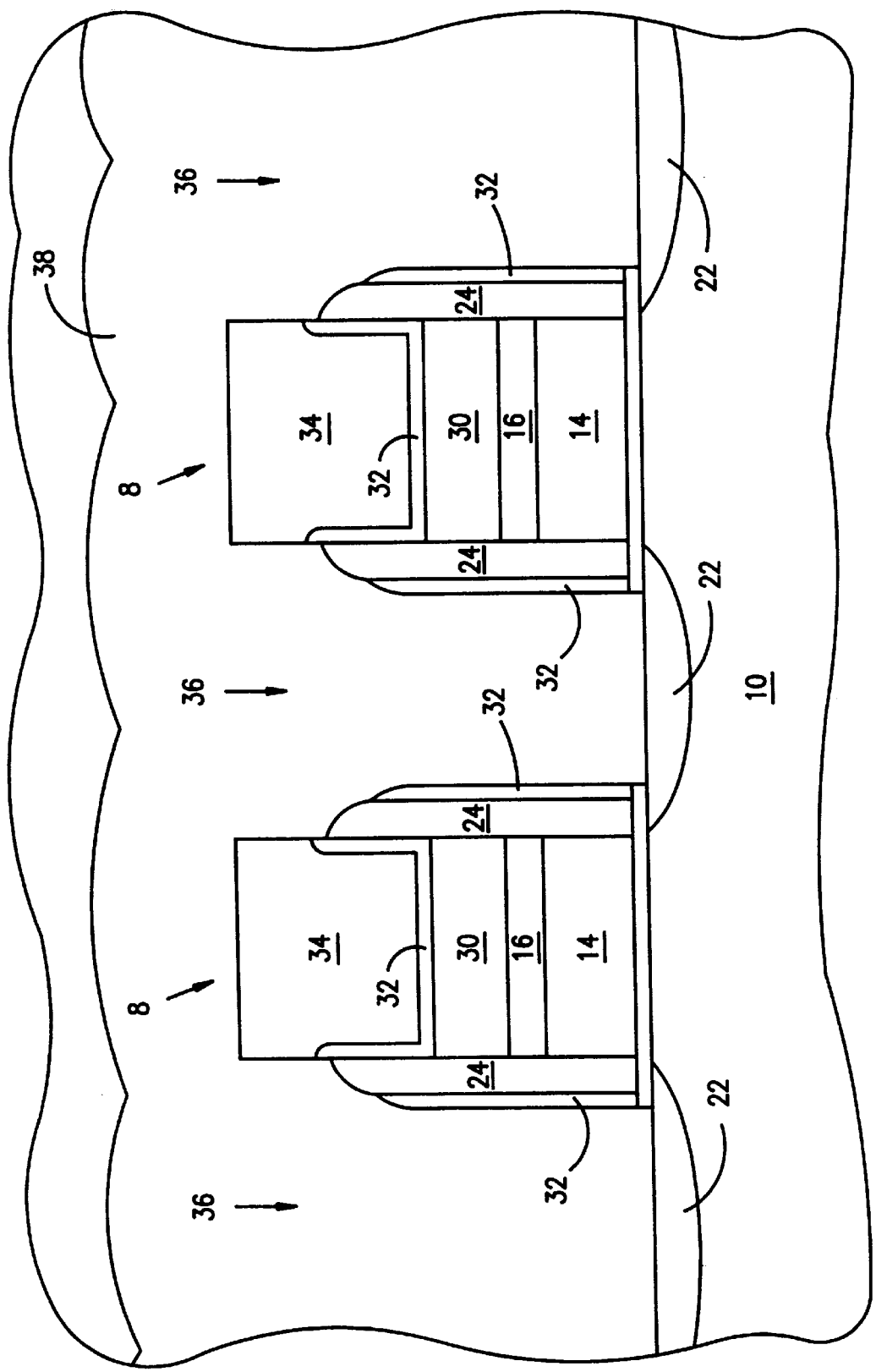
FIG. 8 is a diagrammatic cross-sectional view of a portion of a semiconductor wafer at a processing step subsequent to that shown in FIG. 7.
Figure 9:
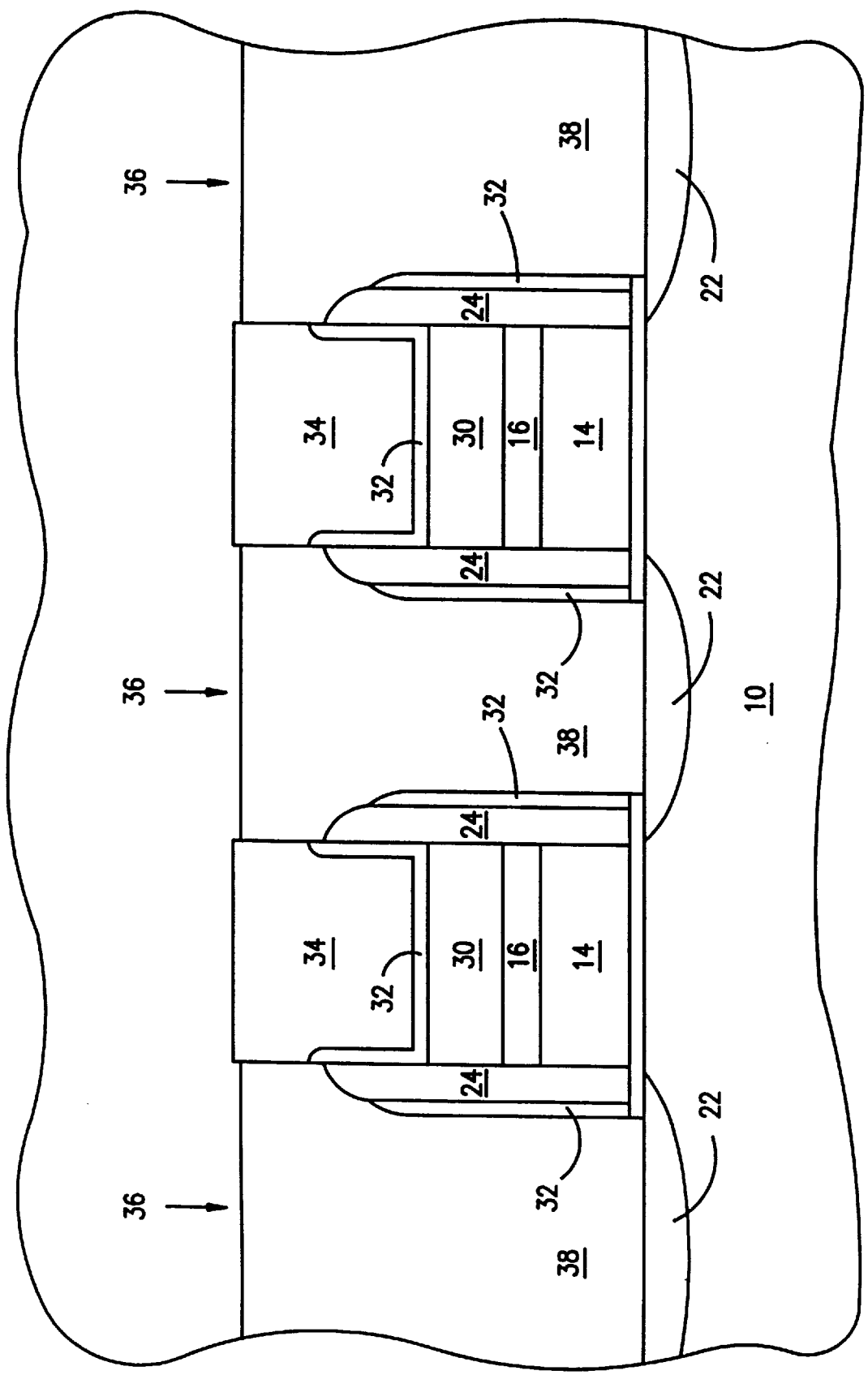
FIG. 9 is a diagrammatic cross-sectional view of a portion of a semiconductor wafer at a processing step subsequent to that shown in FIG. 8.

Any standard DRAM processing may be used from this point forward. In the preferred embodiment, a thin nitride layer 32 is then deposited over the wafer 10, followed by a thick layer 34 of BPSG as shown in FIG. 6. Plug openings 36 are then pattern-etched (e.g. photomasked and dry chemical etched) through the nitride and BPSG layers 32, 34 as shown in FIG. 7. This step results in the removal of all oxide 12 (not shown in FIG. 7) from over the source and drain regions 22. This step also results in BPSG caps 34 being left on top of the gate stacks 8. Next, the entire structure is covered with a layer 38 of polysilicon as shown in FIG. 8. Then the polysilicon layer 38 is dry-etched (or chemical-mechanical planarized) to a level just below the upper surface of the BPSG caps 34 on the gate stacks 8 such that the polysilicon layer 38 forms electrically isolated plugs 38 in each of the plug openings 36 as shown in FIG. 9.

Figure 10:
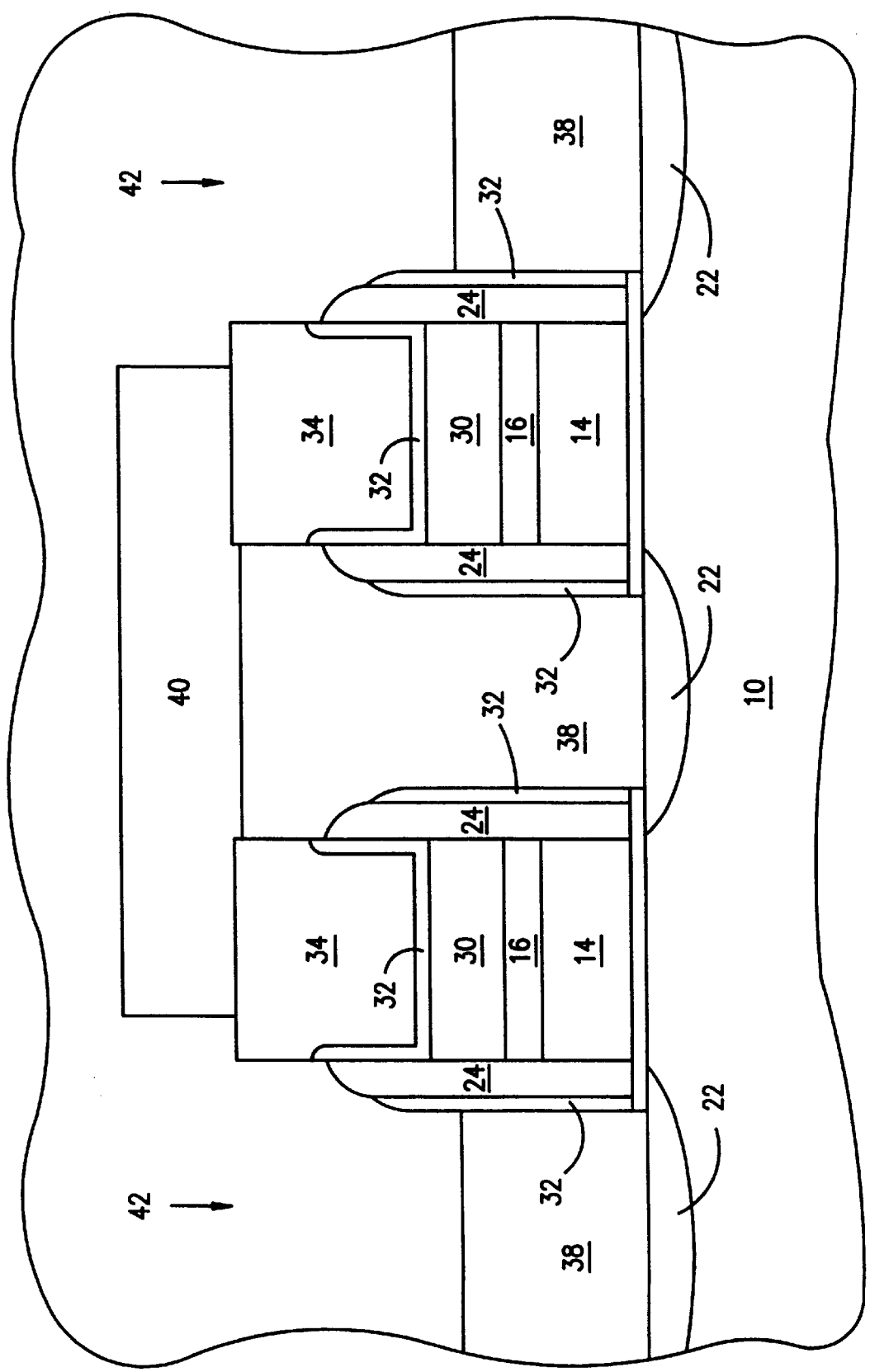
FIG. 10 is a diagrammatic cross-sectional view of a portion of a semiconductor wafer at a processing step subsequent to that shown in FIG. 9.

A layer 40 of BPSG is then deposited and subsequently pattern-etched to form capacitor openings 42 over the source/drain areas 22 that are not to be connected to a bit line (not shown) as shown in FIG. 10. The height of the polysilicon plugs 38 in the capacitor openings 42 is also reduced in this step.

Figure 11:
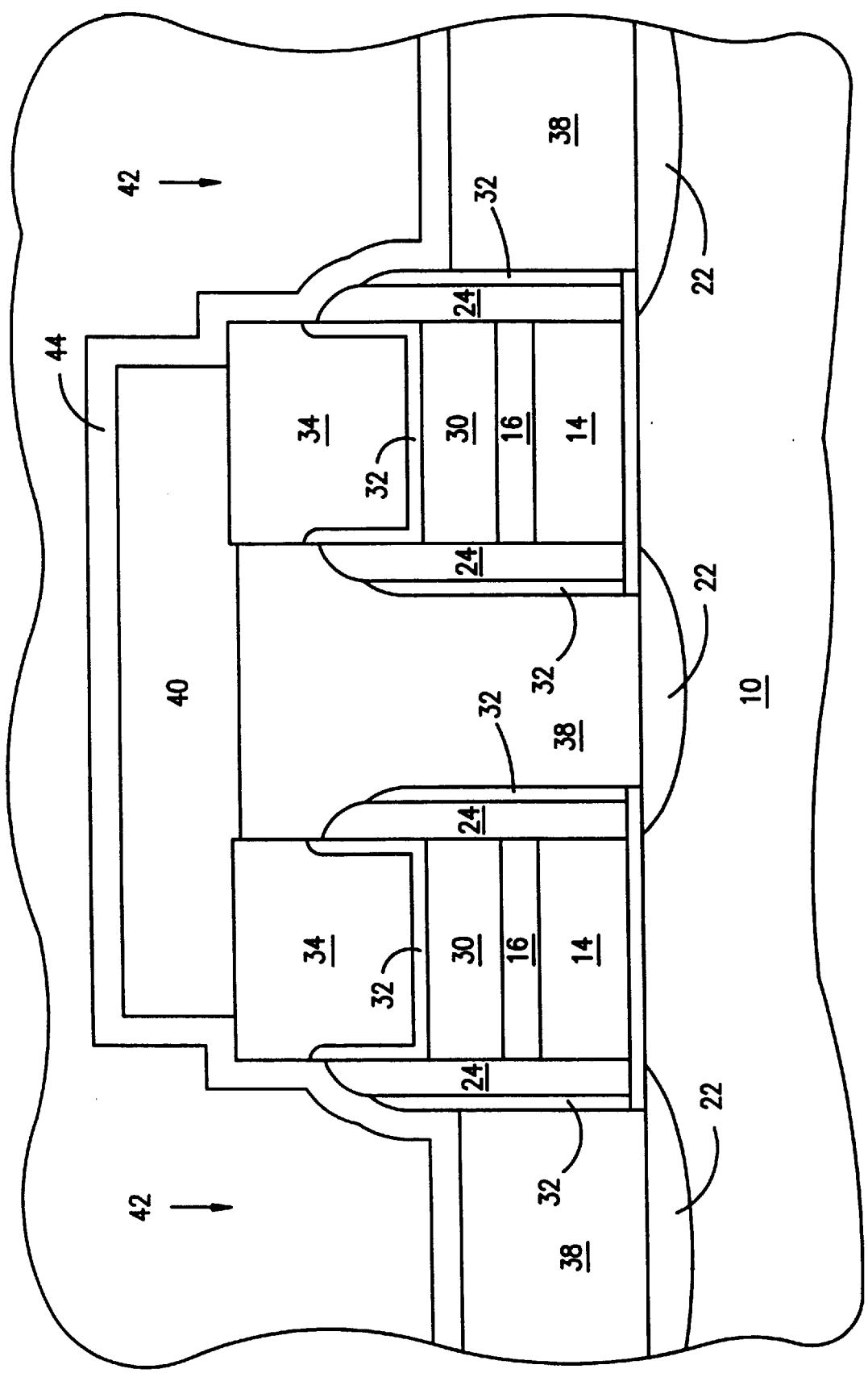
FIG. 11 is a diagrammatic cross-sectional view of a portion of a semiconductor wafer at a processing step subsequent to that shown in FIG. 10.

Next, a layer 44 of conductive material that will eventually form one of the capacitor plates is deposited over the silicon wafer 10 as shown in FIG. 11. The layer 44 may be formed of hemispherical grained polysilicon (HSG) to increase capacitance. If HSG polysilicon is used, the layer 44 may be formed by first depositing a layer of in-situ doped polysilicon followed by a deposition of undoped HSG. Subsequent heating inherent in wafer processing will effectively conductively dope the overlying HSG layer. Alternatively, the conductive layer 44 may be provided by in-situ arsenic doping of an entire HSG layer. The conductive layer 44 is in electrical contact with the previously formed plugs 38 over the non-bit line source/drain areas 22.

Figure 12:
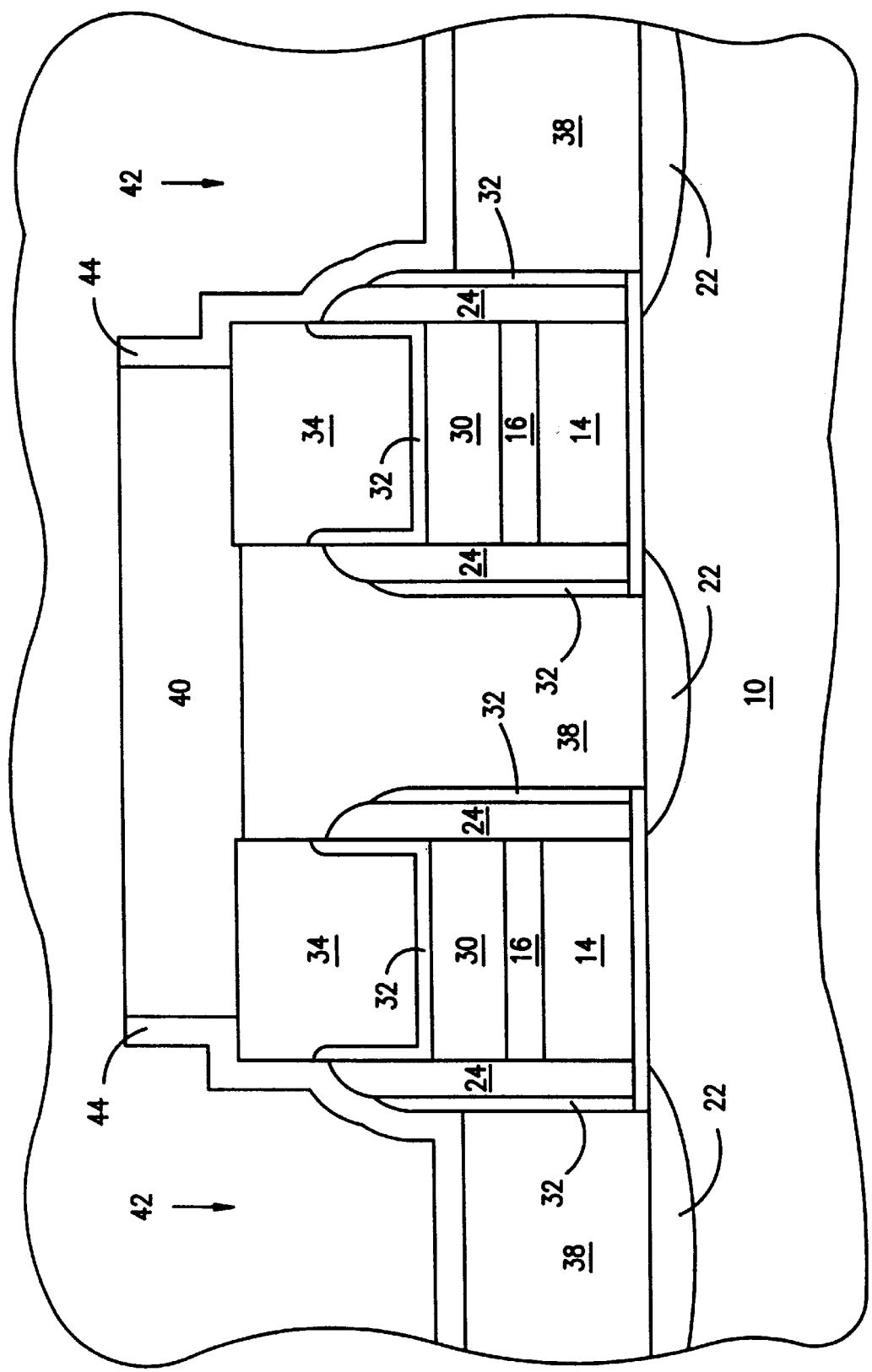
FIG. 12 is a diagrammatic cross-sectional view of a portion of a semiconductor wafer at a processing step subsequent to that shown in FIG. 11.
Figure 13:
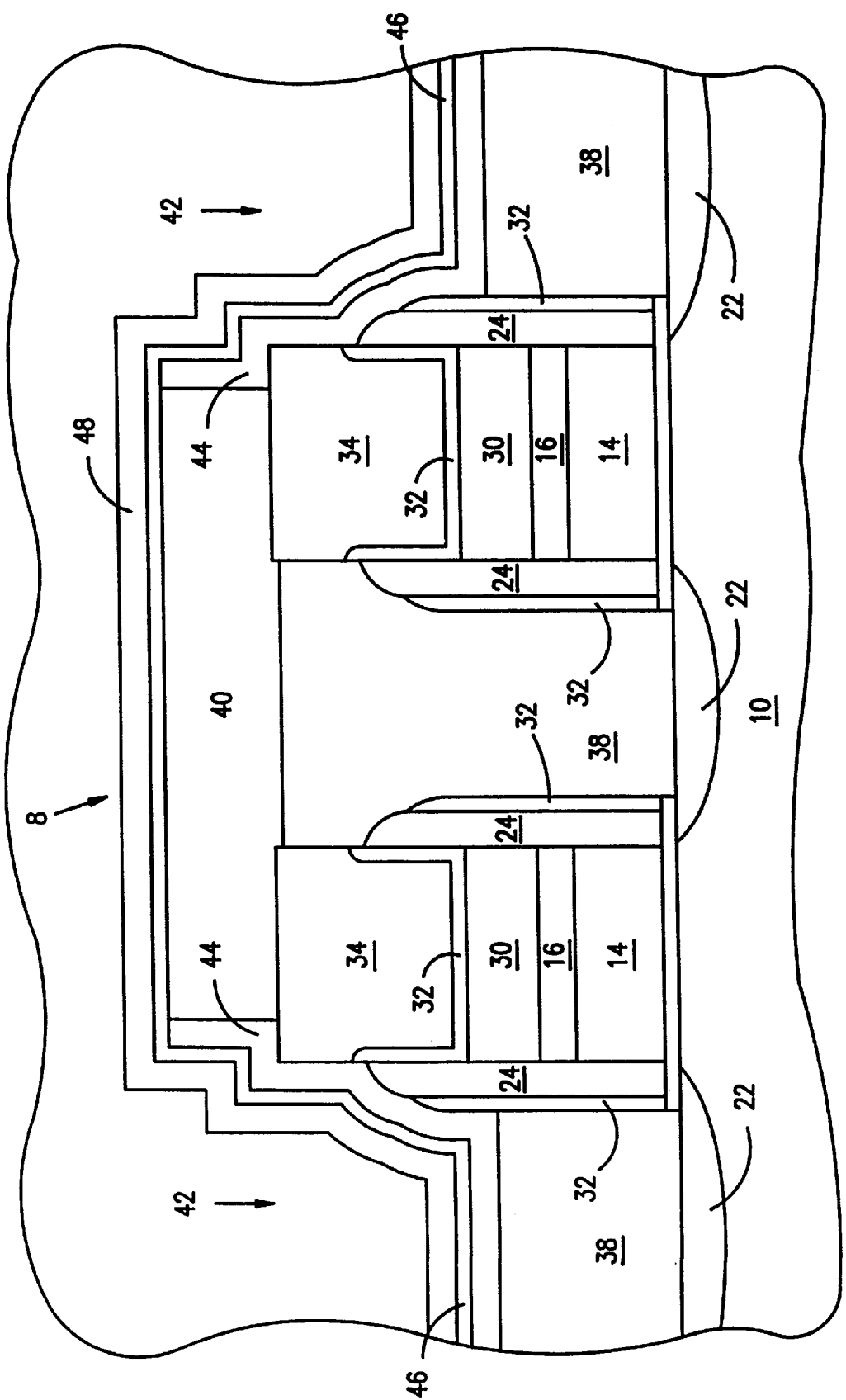
FIG. 13 is a diagrammatic cross-sectional view of a portion of a semiconductor wafer at a processing step subsequent to that shown in FIG. 12.

Referring now to FIG. 12, the portion of the conductive layer 44 above the top of the BPSG layer 40 is removed through a chemical-mechanical planarization or planarized etching process, thereby electrically isolating the portions of layer 44 remaining in the capacitor openings 42. Referring now to FIG. 13, a capacitor dielectric layer 46 is provided over the BPSG layer 40 and over the conductive layer 44 within the capacitor openings 42. The dielectric layer 46 is deposited with a thickness such that the capacitor openings 42 are again not completely filled. The dielectric layer 46 preferably comprises an oxide-nitride-oxide (ONO) dielectric, although other materials are of course possible. A second conductive layer 48 is deposited over the dielectric layer 46, again at a thickness which less than completely fills the capacitor openings 42. The second conductive layer 48 may be composed of polysilicon or a metal. In addition to serving as the second plate of the capacitor, the second conductive layer 48 also forms the interconnection layer.

Figure 14:
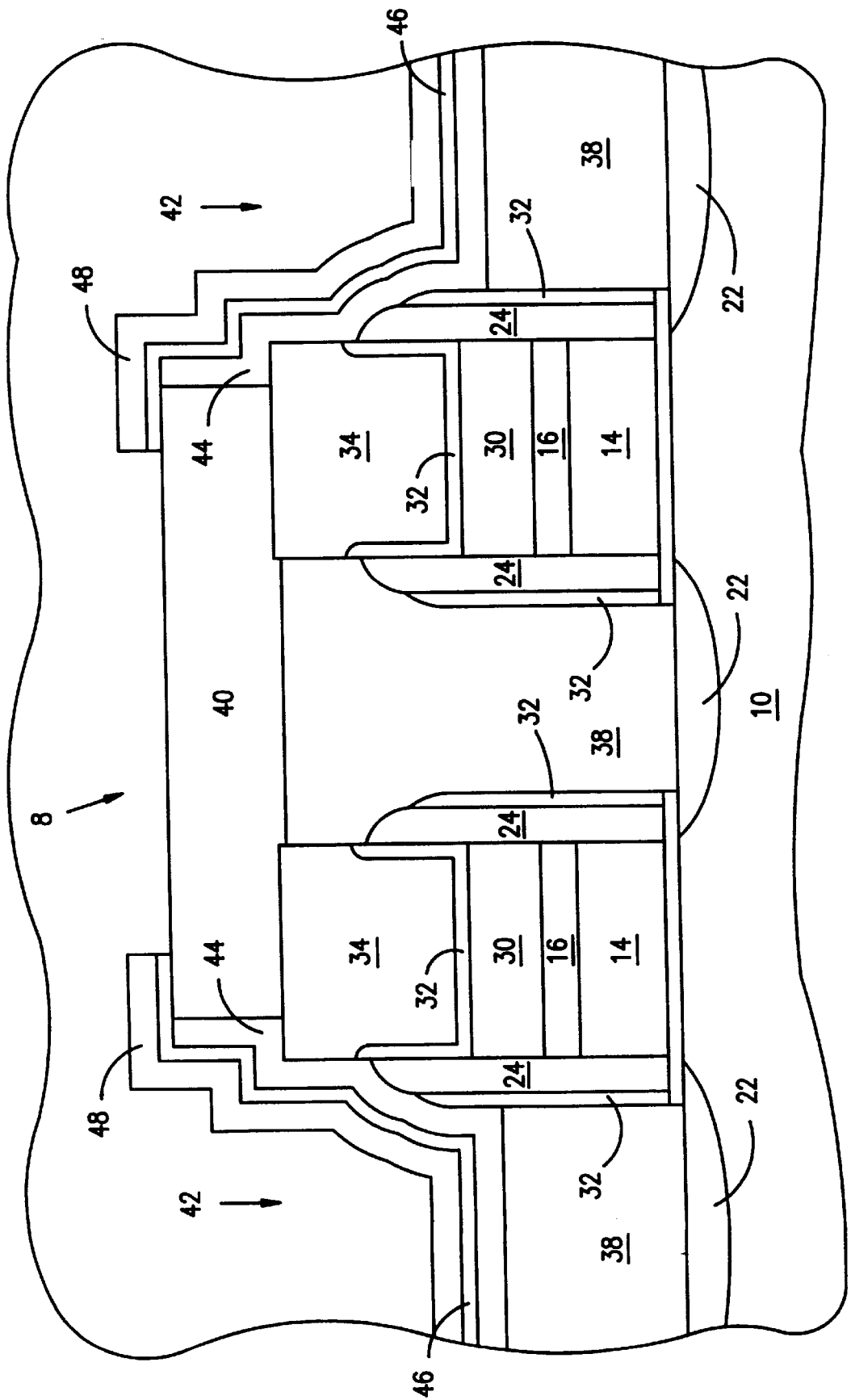
FIG. 14 is a diagrammatic cross-sectional view of a portion of a semiconductor wafer at a processing step subsequent to that shown in FIG. 13.

Referring now to FIG. 14, the second conductive layer 48 and underlying capacitor dielectric layer 46 are patterned and etched over the gate stack 8 such that the remaining portions of each group of the first conductive layer 44, capacitor dielectric layer 46, and second conductive layer 48 over the capacitor openings 42 are electrically isolated from each other. In this manner, each of the source/drain regions 22 are also electrically isolated (without the influence of the gate).

Figure 15:
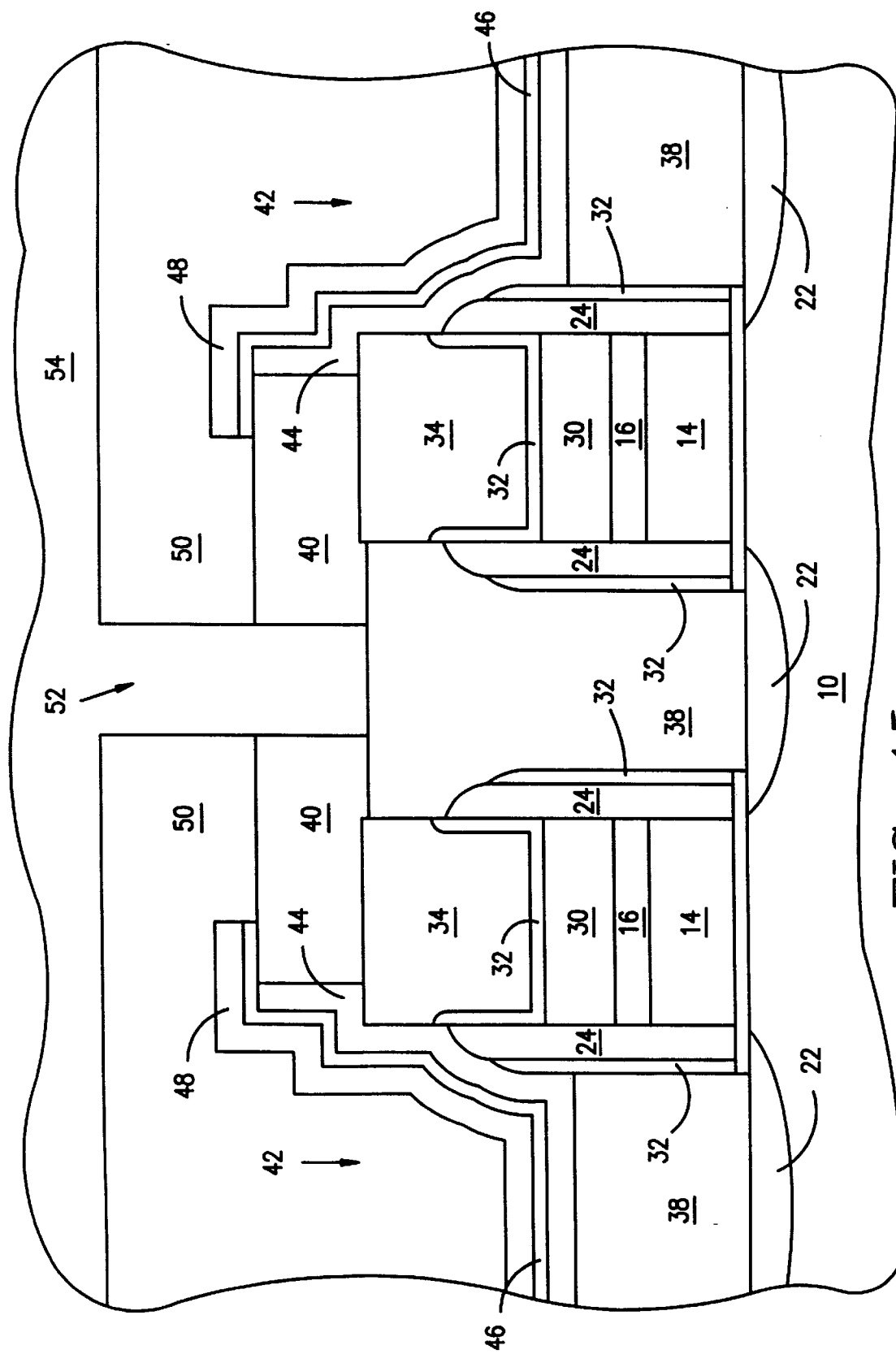
FIG. 15 is a diagrammatic cross-sectional view of a portion of a semiconductor wafer at a processing step subsequent to that shown in FIG. 14.

Referring now to FIG. 15, a bit line insulating layer 50 is provided over the second conductive layer 48 and BPSG layer 40. The bit line insulating layer 50 may also be comprised of BPSG. A bit line contact opening 52 is patterned through the bit line insulating layer 50 such that the conductive bit line plug 38 between the two gate stacks 8 is once again outwardly exposed. Then layer 54 of conductive material is deposited in the bit line contact opening 52 such that the bit line contact is in electrical contact with the outwardly exposed portion of the bit line plug 38 and over the bit line insulating layer 50 to form the bit line and bit line contact. At this point, the DRAM cells have been fully formed. The remainder of the processing for metallic interconnection and passivation is well known in the art and is dependent upon the specific application and will not be discussed in detail further.

It should be noted that some salicide techniques include forming silicide electrodes over the source/drain areas as well as over the polysilicon plug in the gate stack. This was not done in the embodiment described above in order to avoid any problems at the source/drain-silicide interface.

Figure 16:
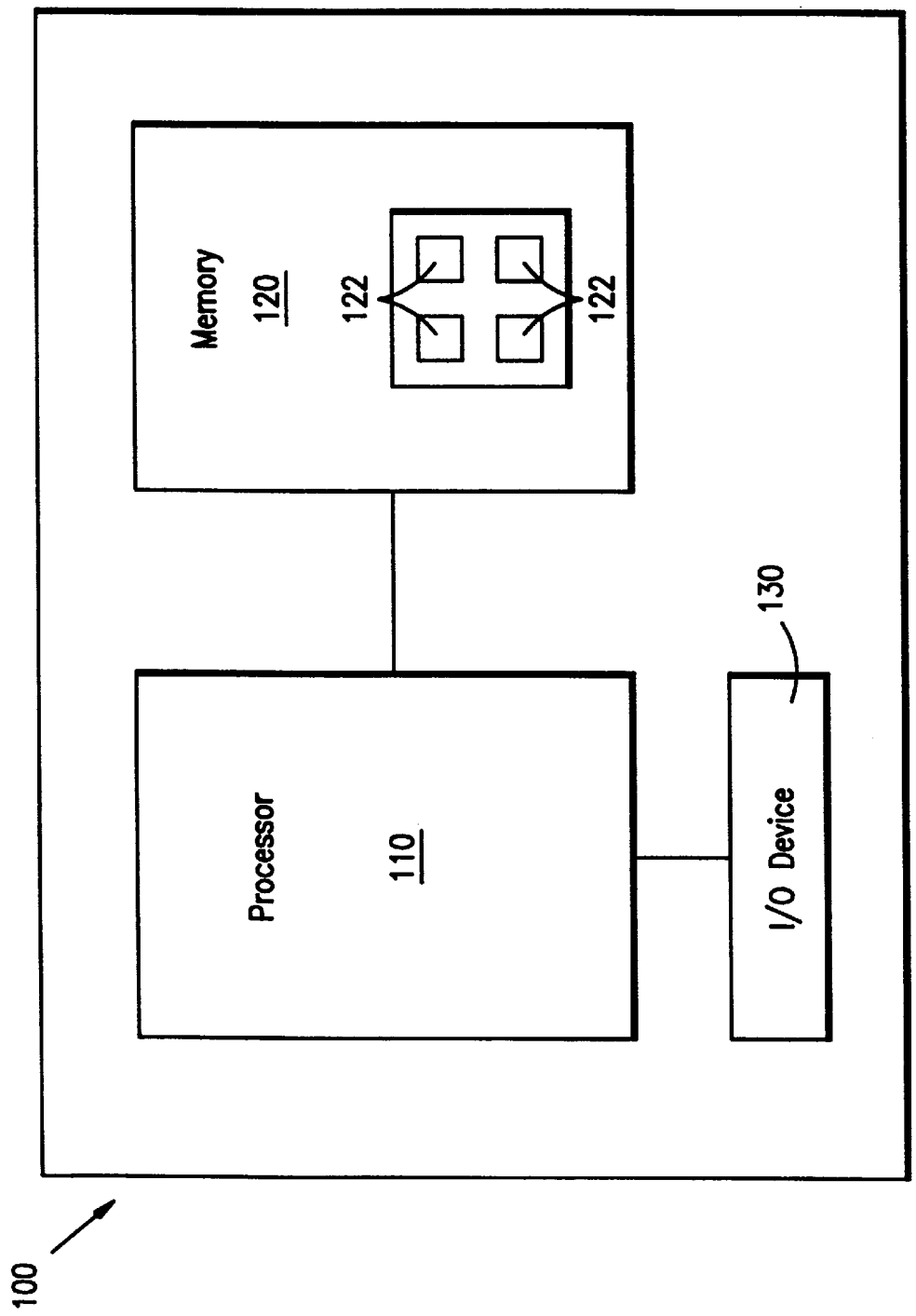
FIG. 16 is a system diagram of a computer system including a memory in constructed in accordance with one embodiment of the present invention.

FIG. 16 illustrates a computer system 100 incorporating a memory cell according to the present invention. The computer system 100 comprises a processor 110, a memory 120 and an I/O device 130. The memory 120 comprises an array of memory cells 122. The memory may be a DRAM, an SDRAM, an SRAM, an EDRAM, an ESRAM, or any other type of memory circuit which is formed in accordance with the invention. The processor 110 may also comprise logic circuits fabricated according to the present invention.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method of forming a conductive polycide layer, the method comprising the steps of
    forming a first polysilicon layer;
    forming a barrier layer in contact with the first polysilicon layer, the barrier layer comprising $ZSi_x$, wherein x is greater than two and Z is chosen from the group consisting of tungsten, tantalum and molybdenum; and
    forming a metal silicide layer in contact with the barrier layer, wherein said metal silicide layer is formed of a different metal than said barrier layer.

2. The method of claim 1, wherein the barrier layer comprises $WSi_x$, wherein x is greater than two.

3. The method of claim 1, wherein the barrier layer is between approximately 150 and approximately 300 angstroms thick.

4. The method of claim 1, wherein the barrier layer is approximately 150 angstroms thick.

5. The method of claim 1, wherein the first polysilicon layer is between approximately 450 angstroms and approximately 3000 angstroms thick.

6. The method of claim 1, wherein the first polysilicon layer is approximately 650 angstroms thick.

7. The method of claim 1, wherein the metal silicide layer is between approximately 300 to approximately 2500 angstroms thick.

8. The method of claim 1, wherein the metal silicide layer is approximately 650 angstroms thick.

9. The method of claim 1, wherein the metal silicide layer comprises a metal selected from the group consisting of cobalt, nickel, palladium, platinum and iridium.

10. The method of claim 1, wherein the metal silicide layer comprises $CoSi_2$.

11. The method of claim 1, wherein the metal silicide layer is formed by depositing a second polysilicon layer and a metal layer in contact with the second polysilicon layer and heating the metal layer and the second polysilicon layer.

12. The method of claim 11, wherein the second polysilicon layer is between approximately 300 and approximately 2500 angstroms thick and the metal layer comprises cobalt silicide and is between approximately 75 angstroms and approximately 750 angstroms thick.

13. The method of claim 11, wherein the second polysilicon layer is approximately 650 angstroms thick and the metal layer is approximately 250 angstroms thick.

14. The method of claim 11, further comprising the step of depositing a titanium layer in contact with the metal layer.

15. The method of claim 14, wherein the titanium layer is approximately 100 angstroms thick.

16. A method of forming a transistor gate stack in an integrated circuit, the method comprising the steps of
  forming a gate dielectric layer;
  forming a first polysilicon layer in contact with the gate dielectric layer;
  forming a barrier layer in contact with the first polysilicon layer, the barrier layer comprising $ZSi_x$, wherein x is greater than two and Z is chosen from the group consisting of tungsten, tantalum and molybdenum; and
  forming a metal silicide layer in contact with the barrier layer, wherein said metal silicide layer is formed of a different metal than said barrier layer.

17. The method of claim 16, wherein the barrier layer comprises $WSi_x$, wherein x is greater than two.

18. The method of claim 16, wherein the barrier layer is between approximately 150 and approximately 300 angstroms thick.

19. The method of claim 16, wherein the barrier layer is approximately 150 angstroms thick.

20. The method of claim 16, wherein the first polysilicon layer is between approximately 450 angstroms and approximately 3000 angstroms thick.

21. The method of claim 16, wherein the first polysilicon layer is approximately 650 angstroms thick.

22. The method of claim 16, wherein the metal silicide layer is between approximately 300 to approximately 2500 angstroms thick.

23. The method of claim 16, wherein the metal silicide layer is approximately 650 angstroms thick.

24. The method of claim 16, wherein the metal silicide layer comprises a metal selected from the group consisting of cobalt, nickel, palladium, platinum and iridium.

25. The method of claim 16, wherein the metal silicide layer comprises $CoSi_2$.

26. The method of claim 16, wherein the metal silicide layer is formed by depositing a second polysilicon layer and a metal layer in contact with the second polysilicon layer and heating the metal layer and the second polysilicon layer.

27. The method of claim 26, wherein the second polysilicon layer is between approximately 300 and approximately 2500 angstroms thick and the metal layer comprises cobalt silicide and is between approximately 75 angstroms and approximately 750 angstroms thick.

28. The method of claim 26, wherein the second polysilicon layer is approximately 650 angstroms thick and the metal layer is approximately 250 angstroms thick.

29. The method of claim 26, further comprising the step of depositing a titanium layer in contact with the metal layer.

30. The method of claim 29, wherein the titanium layer is approximately 100 angstroms thick.

31. A method of forming an integrated circuit comprising at least one transistor, the method comprising the step of:
  forming source and drain areas in a substrate; and forming a gate stack;
  wherein the gate stack forming step comprises:
    forming a gate dielectric layer;
    forming a first polysilicon layer in contact with the gate dielectric layer;
    forming a barrier layer in contact with the first polysilicon layer, the barrier layer comprising $ZSi_x$, wherein x is greater than two and Z is chosen from the group consisting of tungsten, tantalum and molybdenum; and
    forming a metal silicide layer in contact with the barrier layer, wherein said metal silicide layer is formed of a different metal than said barrier layer.

32. The method of claim 31, wherein the barrier layer comprises $WSi_x$, wherein x is greater than two.

33. The method of claim 31, wherein the barrier layer is between approximately 150 and approximately 300 angstroms thick.

34. The method of claim 31, wherein the barrier layer is approximately 150 angstroms thick.

35. The method of claim 31, wherein the first polysilicon layer is between approximately 450 angstroms and approximately 3000 angstroms thick.

36. The method of claim 31, wherein the first polysilicon layer is approximately 650 angstroms thick.

37. The method of claim 31, wherein the metal silicide layer is between approximately 300 to approximately 2500 angstroms thick.

38. The method of claim 31, wherein the metal silicide layer is approximately 650 angstroms thick.

39. The method of claim 31, wherein the metal silicide layer comprises $CoSi_2$.

40. The method of claim 31, wherein the metal silicide layer comprises a metal selected from the group consisting of cobalt, nickel, palladium, platinum and iridium.

41. The method of claim 31, wherein the metal silicide layer is formed by depositing a second polysilicon layer and a metal layer in contact with the second polysilicon layer and heating the metal layer and the second polysilicon layer.

42. The method of claim 41, wherein the second polysilicon layer is between approximately 300 and approximately 2500 angstroms thick and the metal layer comprises cobalt silicide and is between approximately 75 angstroms and approximately 750 angstroms thick.

43. The method of claim 41, wherein the second polysilicon layer is approximately 650 angstroms thick and the metal layer is approximately 250 angstroms thick.

44. The method of claim 41, further comprising the step of depositing a titanium layer in contact with the metal layer.

45. The method of claim 44, wherein the titanium layer is approximately 100 angstroms thick.

46. A method of forming a memory cell, the method comprising the steps of:
  forming at least one capacitor; and forming at least one transistor;
wherein the transistor forming step comprises:
   forming source and drain areas in a substrate; and
   forming a gate stack;
wherein the gate stack forming step comprises:
   forming a gate dielectric layer;
   forming a first polysilicon layer in contact with the gate dielectric layer;
   forming a barrier layer in contact with the first polysilicon layer, the barrier layer comprising $ZSi_x$, wherein x is greater than two and Z is chosen from the group consisting of tungsten, tantalum and molybdenum; and
   forming a metal silicide layer in contact with the barrier layer, wherein said metal silicide layer is formed of a different metal than said barrier layer.

47. The method of claim 46, wherein the barrier layer comprises $WSi_x$, wherein x is greater than two.

48. The method of claim 46, wherein the barrier layer is between approximately 150 and approximately 300 angstroms thick.

49. The method of claim 46, wherein the barrier layer is approximately 150 angstroms thick.

50. The method of claim 46, wherein the first polysilicon layer is between approximately 450 angstroms and approximately 3000 angstroms thick.

51. The method of claim 46, wherein the first polysilicon layer is approximately 650 angstroms thick.

52. The method of claim 46, wherein the metal silicide layer is between approximately 300 to approximately 2500 angstroms thick.

53. The method of claim 46, wherein the metal silicide layer is approximately 650 angstroms thick.

54. The method of claim 46, wherein the metal silicide layer comprises a metal selected from the group consisting of cobalt, nickel, palladium, platinum and iridium.

55. The method of claim 46, wherein the metal silicide layer comprises $CoSi_2$.

56. The method of claim 46, wherein the metal silicide layer is formed by depositing a second polysilicon layer and a metal layer in contact with the second polysilicon layer and heating the metal layer and the second polysilicon layer.

57. The method of claim 56, wherein the second polysilicon layer is between approximately 300 and approximately 2500 angstroms thick and the metal layer comprises cobalt silicide and is between approximately 75 angstroms and approximately 250 angstroms thick.

58. The method of claim 56, wherein the second polysilicon layer is approximately 650 angstroms thick and the metal layer is approximately 750 angstroms thick.

59. The method of claim 56, further comprising the step of depositing a titanium layer in contact with the metal layer.

60. The method of claim 59, wherein the titanium layer is approximately 100 angstroms thick.

61. The method according to claim 1, wherein Z is tantalum.

62. The method according to claim 1, wherein Z is molybdenum.

63. The method according to claim 16, wherein Z is tantalum.

64. The method according to claim 16, wherein Z is molybdenum.

65. The method according to claim 31, wherein Z is tantalum.

66. The method according to claim 31, wherein Z is molybdenum.

67. The method according to claim 46, wherein Z is tantalum.

68. The method according to claim 46, wherein Z is molybdenum.

* * * * *

UNITED STATES PATENT AND TRADEMARK OFFICE
CERTIFICATE OF CORRECTION

PATENT NO. : 6,583,038 B2
DATED : June 24, 2003
INVENTOR(S) : Yongjun J. Hu

It is certified that error appears in the above-identified patent and that said Letters Patent is hereby corrected as shown below:

Column 1,
Line 41, "suicides and near-noble metal suicides" should read -- silicides and near-noble metal silicides --

Signed and Sealed this

Second Day of December, 2003

JAMES E. ROGAN
*Director of the United States Patent and Trademark Office*